United States Patent [19]
Bonis
[11] 3,896,475
[45] July 22, 1975

[54] SEMICONDUCTOR DEVICE COMPRISING RESISTANCE REGION HAVING PORTIONS LATERAL TO CONDUCTORS

[75] Inventor: Maurice Bonis, Herouville, France

[73] Assignee: U.S. Philips Corporation, New York, N.Y.

[22] Filed: Mar. 15, 1974

[21] Appl. No.: 451,528

Related U.S. Application Data

[63] Continuation of Ser. No. 323,847, Jan. 15, 1973, abandoned.

[30] Foreign Application Priority Data

Jan. 28, 1972 France .............................. 72.02947

[52] U.S. Cl. ........................ 357/35; 357/36; 357/34
[51] Int. Cl. ............................ H01l 5/00; H01l 3/00
[58] Field of Search ............. 317/235, 40.12, 40.13, 317/40.1

[56] References Cited

UNITED STATES PATENTS 3,358,197 12/1967 Scarlett .......................... 317/235 Z
3,500,143 3/1970 Lamming ........................ 317/235 Z
3,544,860 12/1970 Lichowsky ...................... 317/235 Z
3,739,239 6/1973 Kerr ................................ 317/235 Z
3,742,319 6/1973 Bryan et al. ...................... 317/235 Z
3,746,949 7/1973 Nienhuis et al. ................ 317/235 Z
R26,803 2/1970 Wolf ................................ 317/235 Z

*Primary Examiner*—Andrew J. James
*Attorney, Agent, or Firm*—Frank R. Trifari; Leon Nigohosian

[57] ABSTRACT

A semiconductor device comprising a semiconductor body comprising a second conductivity type region and at least two active surface zones of opposite first conductivity type forming respective ph-junctions terminating at the body, a substantially strip-shaped resistance region at a surface portion removed from the surface zones and separated from remaining parts of the semiconductor body by a barrier layer, the resistance region comprising plural contact zones and connection zones in alternating positions along the longitudinal direction of the resistance region; plural conductive layers extending between and electrically connecting respective surface zones and contact zones; and a connection conductor contacting the resistance region at at least one of said connection zones.

10 Claims, 2 Drawing Figures

Figure 1:
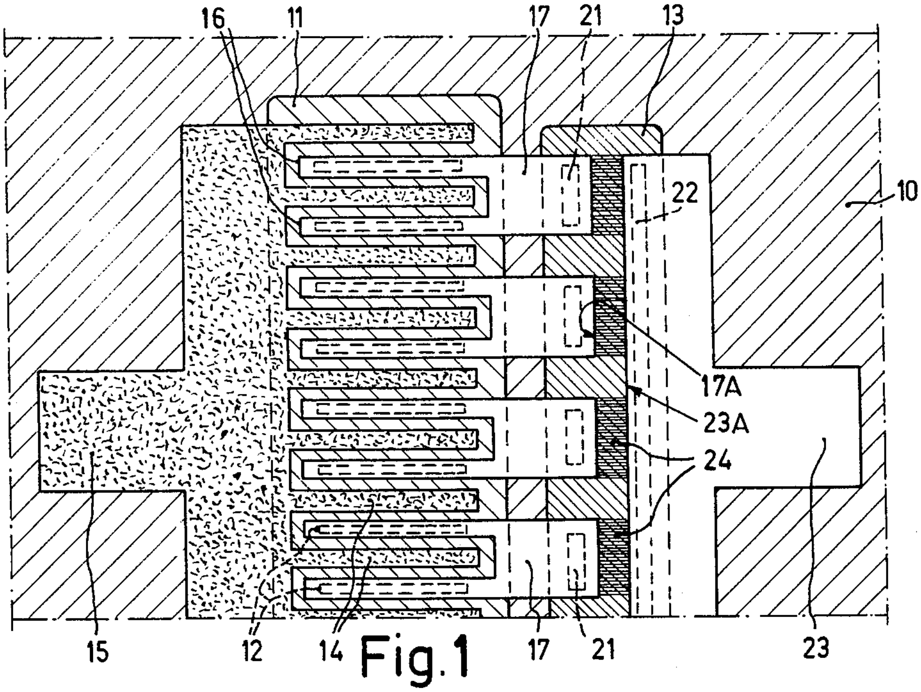

SEMICONDUCTOR DEVICE COMPRISING RESISTANCE REGION HAVING PORTIONS LATERAL TO CONDUCTORS

This is a continuation, of application Ser. No. 323,847, filed Jan. 15, 1973 and now abandoned.

The invention relates to a semiconductor device having a semiconductor body comprising at least two active surface zones of a first conductivity type which form p-n junctions with the adjoining region of the second conductivity type, the pn-junctions terminating at the surface, and a strip-shaped resistance region present at the surface outside said zones and separated from the remaining semiconductor body by a barrier layer, each surface zone being connected to a contact zone of the resistance region by means of a conductive layer, and furthermore a connection conductor contacting the resistance region on one or more connection zones. The invention relates in particular to a high frequency transistor comprising emitter-series resistors.

It is known that in an injecting p-n junction, for example the emitter junction of a transistor which operates at high frequency, the injection of charge carriers in the regions present on either side of the p-n junction takes place mainly in localized small regions of the surface of the junction.

In order to mitigate this, one has resorted in practice to two measures. Firstly, the injecting p-n junction has been divided into a number of island-shaped surface zones which are electrically connected together, as a result of which the current-conveying surface an hence the current to be permitted through the total junction area increases. Secondly, in order to prevent local strong heating and resulting incurable damage of the junction, each of the islands has been provided with a series resistor.

In known devices, various types of series resistors are used, for example, a layer of a resistance material which is separated from the remaining semiconductor body by a barrier layer (for example, a layer of insulating material or a Schottky barrier), or a resistance region which has been provided in the semiconductor body, for example by diffusion, and which forms a p-n junction with the adjoining semiconductor material.

Known structures often comprise a strip-shaped resistance region which is present outside the p and n type zones which form the said p-n junction, the contact zones over which the island-shaped surface zones are connected to the resistance region being present opposite to the connection zone(s) over which the resistance region is contacted by the connection conductor. So in these known devices the series resistors between the island-shaped zones and the connection conductor are substantially formed by portions of the resistance region extending in the direction of width of the strip-shaped resistance region between a contact zone and the connection zone opposite to it which is usually formed by one continuous connection strip in the longitudinal direction of the resistance region, which strip is present opposite to the said contact zones.

One of the drawbacks of the described known resistance structures is that the stray capacitance formed between the resistance region and the underlying semiconductor region is rather large. In particular in the case of a high frequency transistor which has emitter-series resistors and which is operated in a common emitter arrangement, said capacitance constitutes an undesirable increase of the emitter-collector capacity which for a given output power causes a reduction of the collector efficiency and hence gives rise to a increase of the temperature of the p-n junction and a decrease of the power amplification. In the case of a common base arrangement, said stray capacity gives rise to an increased feedback coupling between output and input, as a result of which the danger exists of the occurrence of oscillations and a reduction of the useful maximum frequency occurs.

The object of the invention is, inter alia, to provide a semiconductor device, in particular a transistor, in which the said stray capacity present as a result of the presence of emitter-series resistors is considerably smaller than in known devices.

The invention is based inter alia on the recognition of the fact that said decrease in capacity can be obtained by using a new structure in which the surface area of the resistance region can be considerably smaller.

According to the invention, a semiconductor device of the type described in the preamble is therefore characterized in that, taken in the longitudinal direction of the resistance region, the connection zones and the contact zones alternate.

Alternation of the connection zones and contact zones is to be understood hereinafter to mean that, except possibly at the ends, each contact zone is present between two adjacent connection zones and each connection zone is present between two adjacent contact zones.

In a semiconductor device according to the invention the emitter-series resistors between the contact zones and the connection zones are not formed, as in known devices, by portions of the resistance region which extend in the direction of the width of the strip-shaped resistance region, but are formed by portions which form an angle with said direction of width and hence extend more or less in the longitudinal direction of the resistance region. Therefore the width of the resistance region, with the length remaining the same, can be made considerably smaller as a result of which the surface of the resistance region and the stray capacity which is substantially proportional thereto is decreased to the same extent. For example, the width of the resistance region which in known devices can substantially not be made smaller than approximately 20 microns, can be reduced in a device according to the invention to values between 6 and 8 microns.

Although in principle the connection zones may be connected to the connection conductor, for example, by metal wires, the device according to the invention is preferably constructed so that the connection conductor is in the form of a comb, the teeth of the comb-shaped connection conductor being present at least partly between the contact zones and contacting the resistance region on the said connection zones.

In order to achieve an optimum reduction of the surface area of the resistance region, it is advantageously ensured that the contact zones are substantially in alignment with the connection zones. In this preferred embodiment, the portions of the resistance region which constitute the effective emitter-series resistors extend substantially in the longitudinal direction of the strip-shaped resistance region.

When the resistance region is fully or partly covered with an insulating layer, an important simplification in providing the connection zones and contact zones on the resistance region can be achieved by constructing the device so that the said connection zones and contact zones are all present in one slot-like contact window provided in the insulating layer in the longitudinal direction of the resistance region.

As already stated, the resistance region may consist of a strip-shaped layer of resistance material, for example titanium, which is separated from the semiconductor surface by an insulating layer or which forms a Schottky barrier with the semiconductor surface which is polarized in the reverse direction in the operating condition. However, the device is advantageously constructed so that the resistance region is formed by a surface-adjoining semiconductor region which forms with the adjoining semiconductor material a pn-junction terminating at the surface.

According to the invention, a further very important preferred embodiment is characterized in that the active surface zones of the first conductivity type constitute juxtaposed, mutually substantially parallel strip-shaped emitter zones of a transistor which within the semiconductor body are entirely surrounded by a base zone of the second conductivity type which adjoins a collector zone of the first conductivity type, the longitudinal direction of the resistance region extending preferably substantially normal to the longitudinal direction of the strip-shaped emitter zones.

Although in principle the resistance region may be provided outside the collector zone, the above-described construction of the device is preferably characterized in that the base zone forms with the collector zone a pn-junction terminating at the surface and in that the resistance region is formed by a strip-shaped surface region of the second conductivity type present outside the base zone and inside the collector zone.

Each individual emitter zone may be connected to its own contact zone of the resistance region. According to a preferred embodiment, however, the emitter zones are connected to the same contact zone on the resistance region in groups of at least two by means of conductive layers.

An important preferred embodiment in which the stray capacity of the resistance region is considerably smaller than in known structures is further characterized in that the resistance region has a width of at least 6 and at most 8 microns.

Figure 2:
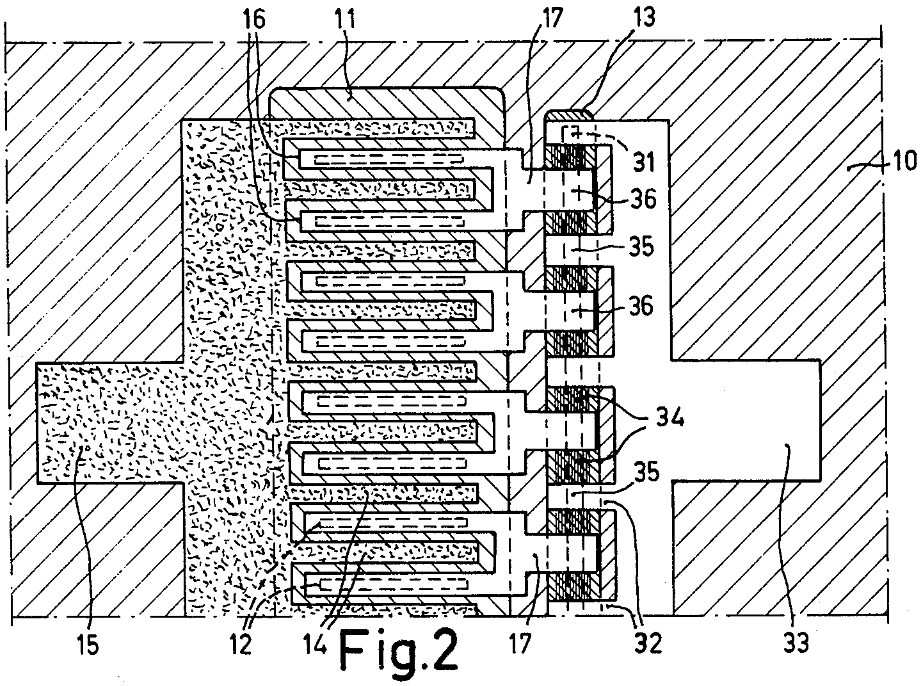

The invention will now be described in greater detail with reference to the drawing, in which:

FIG. 1 is a plan view of a known high frequency transistor which is provided with emitter resistors which are formed by a resistance region of known structure, and FIG. 2 is a plan view of a high frequency transistor according to the invention.

Corresponding elements in the Figures are referred to by the same reference numerals.

The transistors are of the planar type. They may be assumed, for example, to be n-p-n transitors although this is not necessary.

The transistors of FIGS. 1 and 2 both comprise a first n type collector zone 10.

Said collector zone 10 contains the p type base zone 11 and forms therewith a pn-junction terminating at the surface, in which base zone there are provided n-type emitter zones which are constituted by several strip-shaped active surface zones 12 which form with the base zone 11 pn-junctions terminating at the surface.

A strip-shaped resistance region is formed by a p type region 13, for example diffused, which is present in the collector zone 10 beside the base zone 11 and extends substantially normal to the direction of the emitter zones 12. The resistance region 13 is separated from the collector zone 10 by a barrier layer, in this case a p-n junction.

On the base zone 11 are provided contacts in the form of metallized strips 14 which are connected together so as to form in this manner the output connection 15 of the base zone.

Contacts are also formed on the emitter zones 12 by means of metal layers in the form of teeth 16 which are connected to extensions 17 preferably in groups of two.

FIG. 1 furthermore shows apertures 21 which are provided in an insulating layer, for example of silicon oxide, which covers the resistance region 13 to form in this manner contact zones for the metallization teeth 16, one aperture being provided for each pair of teeth.

Another aperture 22 which is parallel to the line of the apertures 21 and which is provided substantially throughout the length of the resistance region 13 forms a connection zone for the connection conductor 23 in the form of a metal layer which forms the output connection of the emitter of the transistor. The contact zones in the windows 21 are present opposite to the connection zone in the window 22.

In the known transistor shown in FIG. 1, the emitter-series resistors 24 (horizontal shading in FIG. 1) are present between the edges 17A of the elongations 17 of the metallization teeth 16 and the edge 23A of the connection conductor 23. The current lines extending through said resistance elements 24 have a direction which on an average is parallel to the direction of the emitter zones 12, that is, parallel to the direction of the width of the resistance region.

FIG. 2 shows a transistor according to the invention. In this case, only one single aperture 31 is provided on the resistance region 13 in the insulating layer which covers the resistance region 13, said aperture 31 extending axially on the resistance region 13.

Adjoining the surface of the resistance region 13 present inside the aperture 31 are alternately teeth 32 of the connection conductor 33 via connection zones 35 and extensions 17 of the emitter metallization teeth 16 via contact zones 36. According to the invention, the connection zones 35 and the contact zones 36, taken in the longitudinal direction of the resistance region 13, alternate with each other, in which in this example they are in alignment.

The teeth 32 are connected to form a comb and thus constitute the output of the connection conductor 33 of the emitter.

The resistance elements 34 (vertical shading in FIG. 2), however, are provided in such manner that the current lines which pass through said resistance elements extend on an average in the longidutinal direction of the resistance region 13.

When comparing FIGS. 1 and 2 it is found that the configuration according to the invention permits a considerable reduction of the width of the strip-shaped resistance region 13.

In practice, the width of the region 13 is between 6 and 8$\mu$m in the case of FIG. 2, while in the case of FIG. 1 the said width cannot be smaller than about 20 to 22 $\mu$m. This difference in width gives rise to a considerable reduction (approximately ⅔) of the stray capacity between the emitter and the collector resulting of the presence of the resistance region 13.

The transistor shown in FIG. 2 can be manufactured while using known masking, diffusion and metallization methods.

The manufacture is carried out, for example, as follows. An epitaxial layer which is to form the collector zone 10 of the transistor is provided on a substrate, for example of silicon. The resistance region 13 is then diffused in said layer 10. The base zone 11 and the surface zones 12 which constitute the emitter zones are then formed successively by another diffusion. Contact windows are then formed on the base zone, on the resistance region 13 and on the emitter zones 12. A metallization layer, for example of aluminium, is then vapour-deposited and processed by means of photoetching methods to form the metal layer parts 14, 15, 16, 17, 32 and 33. For protection of the device a layer of silicon oxide is finally deposited on the surface.

It will be obvious that the invention is not restricted to the examples described but that many variations are possible to those skilled in the art without departing from the scope of this invention. For example, the resistance region 13, instead of a diffused region, may also be a region which has been provided differently, for example by ion implantation. The resistance region may also be a strip-shaped layer of a resistance material which is separated from the semiconductor surface by an insulating layer. The resistance region may also be formed by a metal of a suitable resistivity which forms a Schottky barrier with the adjoining semiconductor material, for example with the collector zone 10, which barrier has to be blocked in the operating condition (just as the p-n junction between the regions 13 and 10 in the examples). The various conductivity types may all be replaced by their opposite conductivity types and the semiconductor material may be a material other than silicon. Other metals and insulating layers may also be used.

Although the greatest reduction of the stray capacitance produced by the resistance region is achieved if, as in FIG. 2, the contact zones and the connection zones are in alignment, an acceptable capacity reduction will in certain circumstances be obtained already if the contact zones and the connection zones are not in alignment, so when the resistance elements between the alternating connection zones and contact zones form a zig-zag line. In addition to a transistor, the device may furthermore be another semiconductor circuit element, for example, a diode or a thyristor.

What is claimed is:

1. A semiconductor device comprising:

a. a semiconductor body having a first surface;

b. a second conductivity type region located in said semiconductor body;

c. at least two active surface zones of a first conductivity type located at said semiconductor body and adjoining said region, said zones and said region forming respective p,n junctions terminating at said surface;

d. a substantially strip-shaped resistance region located at a portion of said surface removed from said zones and separated from remaining parts of said semiconductor body by a barrier layer, said resistance region comprising plural contact zones and at least one connection zone that are disposed at alternating spaced portions along the longitudinal direction of said resistance region;

e. plural conductive layers extending between and electrically connecting respective said surface zones and said contact zones; and f. a connection conductor contacting said connection zones.

2. A semiconductor device as claimed in claim 1, wherein said connection conductor has a substantially comb-shaped configuration and said first portion comprises teeth portions that are present at least partly between various said contact zones and that contact said connection zones.

3. A semiconductor device as claimed in claim 1, wherein said contact zones are substantially aligned with said connection zones.

4. A semiconductor device as claimed in claim 3, further comprising an apertured electrically insulating layer at least partly covering said resistance region, wherein said connection zones and contact zones are all present at a single elongated aperture in said insulating layer, said aperture extending along the longitudinal direction of said resistance region.

5. A semiconductor device as claimed in claim 1, wherein said resistance region is of one conductivity type and comprises a semiconductor region disposed at said surface, said resistance region forming with adjoining semiconductor material of an opposite conductivity type a p,n junction terminating at said surface.

6. A semiconductor device as claimed in claim 1, wherein said surface zones of said first conductivity type have a strip configuration and are disposed in mutually substantially parallel arrangement, said surface zones comprising emitter zones of a transistor and being entirely surrounded within said semiconductor body by a base zone of said second conductivity type, said base zone adjoining a collector zone of said first conductivity type.

7. A semiconductor device as claimed in claim 6, wherein said longitudinal direction of said resistance region extends substantially normal to the longitudinal direction of said emitter zones.

8. A semiconductor device as claimed in claim 7, wherein said base zone and said collector zone form a p,n junction terminating at said surface and said resistance region comprises a strip-shaped surface region of said second conductivity type, said surface region being located outside said base zone and inside said collector zone.

9. A semiconductor device as claimed in claim 7, wherein said conductive layers individually connect respective groups of said emitter zones to respective common contact zones, said groups individually comprising at least two said emitter zones.

10. A semiconductor device as claimed in claim 1, wherein said resistance region has a width of at least about 6 microns and at most about 8 microns.

* * * * *